United States Patent [19]

Shekar et al.

[11] Patent Number: 5,293,054
[45] Date of Patent: Mar. 8, 1994

[54] EMITTER SWITCHED THYRISTOR WITHOUT PARASITIC THYRISTOR LATCH-UP SUSCEPTIBILITY

[75] Inventors: Mallikarjunaswamy S. Shekar; Bantval J. Baliga, both of Raleigh, N.C.

[73] Assignee: North Carolina State University at Raleigh, Raleigh, N.C.

[21] Appl. No.: 980,466

[22] Filed: Nov. 23, 1992

[51] Int. Cl.$^5$ ............... H01L 29/080; H01L 29/520
[52] U.S. Cl. ...................... 257/152; 257/155; 257/276; 257/177
[58] Field of Search .............. 257/137, 141, 144, 162, 257/167, 146, 335, 365, 402, 136, 150, 151, 152, 124, 147

[56] References Cited

U.S. PATENT DOCUMENTS

| | | | |
|---|---|---|---|
| 4,760,431 | 7/1988 | Nakagawa et al. | 257/144 |
| 4,914,496 | 4/1990 | Nakagawa et al. | 257/144 |
| 4,928,155 | 5/1990 | Nakagawa et al. | 357/23.4 |
| 4,954,869 | 9/1990 | Bauer | 357/38 |
| 4,956,690 | 9/1990 | Kato | 357/38 |
| 4,959,703 | 9/1990 | Ogura et al. | 357/38 |
| 4,963,972 | 10/1990 | Shinobe et al. | 357/38 |
| 5,014,102 | 5/1991 | Adler | 257/139 |
| 5,086,323 | 2/1992 | Nakagawa et al. | 357/23.4 |
| 5,089,864 | 2/1992 | Sakurai | 357/23.4 |
| 5,091,766 | 2/1992 | Terashima | 357/38 |
| 5,093,701 | 3/1992 | Nakagawa et al. | 357/23.4 |
| 5,099,300 | 3/1992 | Baliga | 357/37 |
| 5,105,244 | 4/1992 | Bauer | 357/23.4 |
| 5,144,400 | 9/1992 | Bauer | 257/152 |
| 5,144,401 | 9/1992 | Ogura et al. | 357/38 |

OTHER PUBLICATIONS

Baliga, "The MOS-Gaped Emitter Switched Thyristor", IEEE Electron Device Letters, vol. 11, No. 2, pp. 75-77, Feb. 1990.

Baliga, Adler, Gray and Love, "The Insulated Gate Rectifier (IGR): A New Power Switching Device," IEEE, IEDM-82, pp. 264-267, 1982.

Temple, "MOS Controlled Thyristors (MCT'S)", IEDM-84, pp. 282-285, 1984.

Baliga, Adler, Love, Gray and Zommer, "The Insulated Gate Transistor: A New Three-Terminal MOS-Controlled Bipolar Power Device", IEEE Transactions on Electron Devices, vol. ED-31, No. 6, pp. 821-828, Jun., 1984.

Baliga and Chang, "The MOS Depletion-Mode Thyristor: A New MOS-Controlled Bipolar Power Device", IEEE Electron Device Letters, vol. 8, No. 8, pp. 411-413, Aug., 1988.

(List continued on next page.)

Primary Examiner—Rolf Hille
Assistant Examiner—David B. Hardy
Attorney, Agent, or Firm—Bell, Seltzer, Park & Gibson

[57] ABSTRACT

An emitter switched thyristor without parasitic thyristor latch-up susceptibility includes a thyristor having an anode region, a first base region, a second base region in the first base region and an emitter region of first conductivity type in the second base region. An electrical connection is provided between the emitter region and the cathode contact by a field effect transistor in the first base region. The transistor is positioned adjacent the second base region and includes a source electrically connected to the emitter region by a metal strap on the surface of the substrate. The drain of the transistor is electrically connected to the cathode contact and has a conductivity type opposite the conductivity type of the first base region. Accordingly, the cathode contact and anode contact are not separated by a four layer parasitic thyristor. Parasitic latch-up operation is thereby eliminated.

23 Claims, 10 Drawing Sheets

OTHER PUBLICATIONS

Nandakumar, Baliga, Shekar, Tandon and Reisman, "A New MOS-Gated Power Thyristor Structure with Turn-Off Achieved by Controlling the Base Resistance," IEEE Electron Letters, vol. 12, No. 5, pp. 227-229, May, 1991.

Shekar, Baliga, Nandakumar, Tandon and Reisman, "Characteristics of the Emitter-Switched Thyristor", IEEE Transactions on Electron Devices, vol. 38, No. 7, pp. 1619-1623, Jul., 1991.

Nandakumar, Baliga, Shekar, Tandon and Reisman, "The Base Resistance Controlled Thyristor (BRT) 'A New MOS Gated Power Thyristor'", IEEE, pp. 138-141, 1991.

Shekar, Baliga, Nandakumar, Tandon and Reisman, "Experimental Demonstration of the Emitter Switched Thyristor", pp. 128-131.

"The Thyristor", Section 4.5, Bipolar Devices, pp. 147-151.

"The Enhancement-Type MOSFET", Metal-Oxide-Semiconductor Field-Effect Transistors (MOSFETs), pp. 310-311.

EMITTER SWITCHED THYRISTOR WITHOUT PARASITIC THYRISTOR LATCH-UP SUSCEPTIBILITY

FIELD OF THE INVENTION

The present invention relates to semiconductor switching devices, and more particularly to thyristors with MOS-gated control.

BACKGROUND OF THE INVENTION

The development of semiconductor switching technology for high power applications in motor drive circuits, appliance controls, robotics and lighting ballasts, for example, began with the bipolar junction transistor. As the technology matured, bipolar devices became capable of handling large current densities in the range of 40–50 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a gate electrode bias is applied for turn-on and turn-off control. Turn-on occurs when a conductive channel is formed between the MOSFET's source and drain regions under an appropriate gate bias. The gate electrode is separated from the device's channel by an intervening insulator, typically silicon dioxide. Because the gate is insulated from the channel, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry can be easily implemented on a single chip. As compared to bipolar technology, the simple gate control provides for a large reduction in cost and a significant improvement in reliability.

These benefits are offset, however, by the relatively high on-resistance of the MOSFET's channel, which arises from the absence of minority carrier transport. As a result, the device's operating forward current density is limited to relatively low values, typically in the range of 10 A/cm$^2$, for a 600 V device, as compared to 40–50 A/cm$^2$ for the bipolar transistor.

On the basis of these features of power bipolar transistors and MOSFET devices, hybrid devices embodying a combination of bipolar current conduction with MOS-controlled current flow were developed and found to provide significant advantages over technologies employing bipolar junction transistors or MOSFETs alone. Thus, in the Insulated Gate Bipolar Transistor (IGBT), disclosed in an article by coinventor B. J. Baliga, M. S. Adler, R. P. Love, P. V. Gray and N. Zommer, entitled *"The Insulated Gate Transistor: A New Three terminal MOS Controlled Bipolar Power Device,"* IEEE Trans. Electron Devices, ED-31, pp. 821–828 (1984), on-state losses were shown to be greatly reduced when compared to power MOSFETs. This was caused by the conductivity modulation of the IGBT's drift region during the on-state. Moreover, very high conduction current densities in the range of 200–300 A/cm$^2$ can also be achieved. Accordingly, an IGBT can be expected to have a conduction current density approximately 20 times that of a power MOSFET and five (5) times that of an equivalently sized bipolar transistor. Typical turn-off times for the IGBT can be expected to be in the range of 10–50 μs. A cross-sectional representation of a typical insulated gate bipolar transistor is shown in FIG. 1.

Although gate-controlled bipolar transistors, such as the IGBT, represent an improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased and most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's regeneratively coupled P1-N1-P2 and wide base P1-N2-P2 transistors exceeds unity. An alternative to providing external circuitry or reversing the anode potential to obtain turn-off, however, is to use a MOS-gate or similar device for controlling turn-on and turn-off.

Several methods for obtaining gate control over thyristor action exist. For example, in the MOS-controlled thyristor (MCT), turn-off is provided by shorting the emitter-base junction of the N-P-N transistor to thereby produce a reduction in gain. This form of control ideally raises the holding current of the thyristor to a level above the operating current level. Accordingly, an MCT structure has been reported which utilizes a P-channel MOSFET integrated into the cathode region of a thyristor for turn-off control, and an N-channel MOSFET integrated into the P-base region for turn-on control. This device and its complementary counterpart are described in an article by V. A. K. Temple, entitled "MOS Controlled Thyristors (MST's) published in IEDM Technology Digest, Abstract 10.7, pp. 282–285, (1984). FIG. 2 schematically illustrates a prior art MCT as shown in FIGS. 2 and 3 from the aforesaid Temple article. However, the maximum controllable current density, which is a direct measure of a device's ability to turn-off, is limited by the MOSFET inversion-layer channel resistance and other resistances in the base region. Because of the lower mobility for holes in silicon, MCTs built from n-type high-voltage drift layers exhibit poor current turn-off characteristics. MCTs, such as the one described in U.S. Pat. No. 5,105,244 to Bauer, have also been built to include inverted diodes between the anode and cathode for providing enhanced inductive-load switching characteristics, without the need for an external diode in antiparallel with the MCT.

Other examples of MOS-gated thyristors include the depletion-mode thyristor (DMT), shown in FIG. 3, which overcame many of the drawbacks associated with the MCT. In the DMT, a depletion-mode MOSFET is placed in series with the base of the P-N-P transistor. Accordingly, once the thyristor is turned-on, current flow can be shut off by application of a negative gate bias. This eliminates the base drive by pinching off the base current to the P-N-P transistor and shutting off the device. Also, in U.S. Pat. No. 5,144,401 to Ogura et al., an insulated-gate thyristor is disclosed having two gate electrodes for controlling turn-on and turn-off. The first gate is separately isolated from the first base region and operates a MOSFET between the second emitter region (cathode) and the first base region. The second gate is laterally disposed with respect to the cathode and electrically contacts the second base region. Both turn-on and turn-off require the sequential control of both gate electrodes.

Recently, a base resistance controlled thyristor (BRT) was described in U.S. Pat. No. 5,099,300, to coinventor B. J. Baliga, and an article entitled "*A New MOS-Gated Power Thyristor Structure with Turn-Off Achieved by Controlling the Base Resistance,*" by M. Nandakumar, coinventors B. J. Baliga and M. Shekar, and S. Tandon and A. Reisman, IEEE Electron Device Letters, Vol. 12, No. 5, pp. 227–229, May, 1991, both of which are hereby incorporated herein by reference. The BRT operates by modulating the lateral P-base resistance of the thyristor using MOS gate control. Operational BRTs with 600-volt forward blocking capability, such as the one shown in FIG. 4, have been developed. FIG. 4 is a reproduction of FIG. 1 from the aforesaid Nandakumar, et al. article. The BRT can be turned-off by the application of a negative bias to a P-channel enhancement-mode MOSFET to thereby reduce the resistance of the P-base by shunting majority charge carriers to the cathode. As will be understood by one skilled in the art, the reduction in P-base resistance results in an increase in the device's holding current to above the operational current level and shuts-off the device.

In another device, described in an article entitled "*The MOS-Gated Emitter Switched Thyristor,*" by coinventor B. J. Baliga, published in IEEE Electron Device Letters, Vol. 11, No. 2, pp. 75–77, February, 1990, turn-on is achieved by forcing the thyristor current to flow through an N-channel enhancement-mode MOSFET and floating N+ emitter integrated within the P-base region. This article is hereby incorporated herein by reference. A cross-sectional representation of this structure and equivalent circuit is shown in FIGS. 5A and 5B, which are reproductions of FIG. 1 from the aforesaid Baliga article. As will be understood by one skilled in the art, the length of the floating N+ emitter region, which determines the value of large resistance R shown in FIG. 5B, controls the holding and triggering current for the device. Turn-off of the emitter switched device (EST) is accomplished by reducing the gate voltage on the MOSFET to below the threshold voltage. This cuts off the floating N+ region from the cathode and ideally shuts-off the device.

Unfortunately, the integration of the MOSFET into the P-base region causes a parasitic thyristor to be formed, as shown in FIG. 5A, wherein the N+ source region of the N-channel MOSFET also comprises the N+ emitter of the vertical parasitic thyristor between the anode and cathode. If this thyristor turns-on, the EST can no longer be turned off by reducing the MOSFET gate voltage to zero. Turn-on of the parasitic thyristor is initiated by the onset of electron injection from the N+ emitter region of the parasitic thyristor when forward biased, and is dictated by the resistance of the P-base under the N+ emitter region. The likelihood that parasitic latch-up will occur can be reduced if the P-base resistance (small R) is lowered by making the length of the N+ emitter region small and by using a P+ diffusion to reduce the sheet resistance of the P-base. By keeping the resistance under the N+ emitter of the parasitic thyristor as small as possible, the likelihood that the P+/N+ junction will become forward biased when the thyristor is turned-on is reduced. The likelihood of injection of electrons from the N+ emitter can also be reduced by shorting the P+ diffusion to the cathode, as shown. Notwithstanding these techniques to prevent latch-up, however, a multicell EST switching device rated for 1 amp and 600 volts has been shown to be susceptible to parasitic latch-up failure at about 2.5 amps for a gate voltage of 10 volts. This low latch-up level limits the suitability of using emitter switched devices for higher current applications.

Other attempts to limit the likelihood of sustained parasitic latch-up have been made. For example, in a related copending application entitled Emitter Switched Thyristor with Base Resistance Control, U.S. Ser. No. 07/897,456, filed Jun. 10, 1992, by the inventors herein, the probability of sustained parasitic thyristor action was reduced by incorporating a current diverting means adjacent the parasitic thyristor to thereby reduce the effective resistance of the second base region (P-base) during turn-off and further inhibit latch-up by preventing the forward biasing of the P+/N+, junction beneath the cathode.

Notwithstanding these attempts to limit the susceptibility to sustained parasitic thyristor latch-up, the presence of an adjacent parasitic thyristor between the anode and cathode poses a risk that under certain operating conditions, parasitic latch-up will occur.

SUMMARY OF THE INVENTION

It is therefore an object of the present invention to provide a semiconductor switching device with high input impedance, low on-state voltage drop and controlled turn-on and turn-off characteristics.

It is another object of the present invention to provide a semiconductor switching device having thyristor operating characteristics at high current densities and wherein the susceptibility to parasitic latch-up is suppressed.

These and other objects are provided, according to the present invention, by an emitter switched thyristor including means for suppressing conduction between the emitter and cathode contact regions in response to a turn-off bias signal while also preventing the formation of a parasitic thyristor and sustained latch-up during transient operating conditions. In other words, it has been found according to the present invention, that a gate control structure can be provided to suppress conduction in an emitter switched device, without itself forming a parasitic thyristor with the body of the device.

In particular, an embodiment of an emitter switched thyristor according to the present invention comprises an anode region, a first base region, a second base region and an emitter region of first conductivity type in the second base region. In addition, a cathode contact region of opposite conductivity type from that of the emitter region is provided adjacent the second base region. In order to achieve turn-on of the emitter switched thyristor, the emitter region is electrically connected to both the cathode contact region and the first base region and the anode is biased positive with respect to the cathode contact region.

The electrical connection between the emitter and cathode contact regions is preferably accomplished, in part, using the channel of an enhancement-mode field effect transistor such as a P-channel MOSFET. This includes, for example, using the cathode contact region as the drain and preferably a highly doped P-type region, formed in the second base region (P-base) for the source. The source can also be formed adjacent the second base region. Shunting means is also provided for electrically connecting the source to the emitter region of opposite conductivity type (N-type). This latter electrical connection is preferably provided by shunting means comprising a metal strap on the surface of the semiconductor substrate, but other techniques for connecting the source and emitter may be used. For example, if the source is outside the second base region, a metal strap on top of an insulating region on the surface of the semiconductor substrate may be used to connect the emitter to the source.

A turn-on gating means is also provided to electrically connect the emitter and first base regions in response to a second or turn-on bias signal. Preferably, an N-channel enhancement-mode MOSFET is used to provide a conductive channel between the emitter and first base regions when a turn-on bias is applied thereto. The channel is preferably formed in the second base region at the surface of the semiconductor substrate. In this embodiment, the thyristor comprises a 4-terminal device having an anode terminal, a cathode terminal, a first gate control terminal for electrically connecting the emitter and cathode contact regions and a second gate control terminal for forming the conductive channel in the second base region to thereby electrically connect the emitter to the first base region. The first and second gate control terminals are electrically connected to the gates of the P-channel and N-channel enhancement-mode MOSFETS, respectively, and are responsive to signal biases of opposite polarity.

Alternatively, an N-channel depletion-mode MOSFET comprising a conductive N-type region in the second base region can be used if single gate control is desired for both turn-on and turn-off. In this embodiment, single gate control is achieved by electrically connecting the gate of the depletion-mode transistor to a cathode metallization layer on the cathode contact region.

The means for providing an electrical connection between the cathode contact region and the emitter region is also a conduction suppressing means for turning off the thyristor in response to a turn-off bias signal. In particular, because the cathode contact region is of opposite conductivity type with respect to the emitter, the formation of a vertical parasitic thyristor between the anode region and cathode contact region is prevented. In other words, other than in the active thyristor region, there is no contiguous four-layer P-N-P-N region between the anode and cathode capable of providing sustained parasitic latch-up and preventing turn-off of the device. Thus, rather than merely reducing the likelihood that sustained parasitic latch-up will occur, the parasitic thyristor is eliminated altogether from between the anode and cathode.

In addition to reducing the likelihood of sustained parasitic latch-up, the likelihood of device breakdown during turn-off can be reduced by incorporating an breakdown prevention means adjacent the second base region. Preferably, a P-channel enhancement-mode MOSFET can be used to provide an alternate electrical path from the second base region to the cathode during turn-off. The breakdown prevention means also increases the rate of turn-off by shunting excess majority carriers in the second base region to the cathode when the conduction suppressing means is activated.

BRIEF DESCRIPTION OF THE DRAWINGS

FIG. 8 illustrates a cross-sectional representation for the semiconductor switching device of FIG. 7, taken along line 9—9'.

DESCRIPTION OF PREFERRED EMBODIMENTS

The present invention will now be described more fully hereinafter with reference to the accompanying drawings, in which preferred embodiments of the invention are shown. This invention may, however, be embodied in different forms including complementary structures and should not be limited to the embodiments set forth herein. Rather, these embodiments are provided so that this disclosure will be thorough and complete, and will fully convey the scope of the invention to those skilled in the art. Like numbers refer to like elements throughout.

Figure 6A:
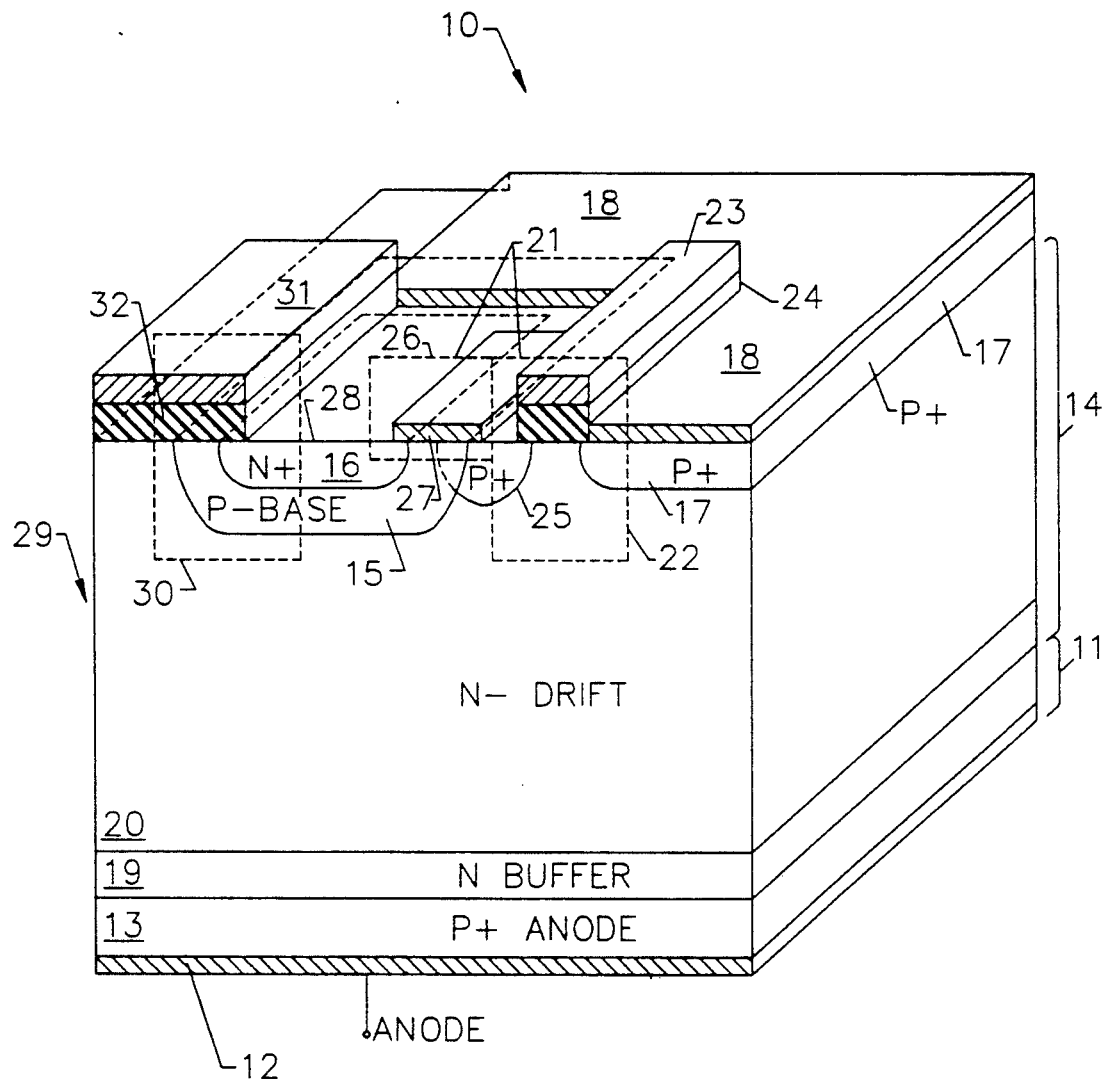
FIG. 6A illustrates a three-dimensional cross-sectional representation of a semiconductor switching device according to a first embodiment of the present invention.

Referring now to FIG. 6A, a three-dimensional representation of the semiconductor switching device 10 according to one embodiment of the present invention is shown. The switching device 10 includes a thyristor having an anode region 11, a first base region 14, a second base region 15, and an emitter region 16 in the second base region 15. The switching device 10 further includes a cathode contact region 17 in the first base region 14. The cathode contact region 17 is adjacent the second base region 15 and is electrically connected to a cathode metallization layer 18. The cathode contact region 17 and cathode metallization layer 18 collectively comprise the cathode contact. The cathode contact region 17 and emitter region 16 are of opposite conductivity type. Preferably, the anode region 11 comprises an anode metallization layer 12 and highly doped anode layer 13. The first base region may also comprise a buffer layer 19 and lightly doped drift region 20 of first conductivity type.

Means 21 for electrically connecting the cathode contact region 17 to the emitter region 16 is also provided. This means 21 preferably includes a first field effect transistor 22 having a gate 23, insulating region 24, and source 25 in the first base region 14. The source 25 is preferably connected to the second base region 15 of same conductivity type. Means 21 also includes shunting means 26 for electrically connecting the source 25 of the first field effect transistor 22 to the emitter region 16. Shunting means 26 is preferably provided by a metal strap 27 on the surface 28 of the semiconductor substrate 29.

Although other conventional techniques such as light activation can be used for turning on the thyristor once the emitter region 16 and cathode contact region 17 are electrically connected, a turn-on gating means 30 is provided for electrically connecting the emitter region 16 to the first base region 14 in response to a turn-on bias signal. Turn-on gating means 30 preferably comprises a field effect transistor. The transistor can be an enhancement-mode MOSFET having a gate 31 and insulating region 32.

According to the first embodiment of the present invention shown in FIG. 6A, turn on of the switching device 10 can be achieved as follows. First, to facilitate conduction in the thyristor, the emitter region 16 and cathode contact region 17 are electrically connected by applying a negative gate bias to the gate 23 of the first field effect transistor 22. As will be understood by one skilled in the art, the application of a negative bias to the gate 23 causes the formation of a p-type channel beneath the insulating region 24 at the surface 28 of the semiconductor substrate 29 and electrically connects the cathode contact region 17 (drain) to the source 25. The shunting means 26 provides the additional electrical connection to the emitter region 16. To achieve turn-on in the present embodiment, however, the emitter region is also electrically connected to the first base region 14 by the application of a positive bias to gate 31. The application of a positive bias to gate 31 causes the formation of an n-type channel in the second base region 15 immediately beneath the insulating region 32. Accordingly, by applying a negative bias to gate 23 and a positive bias to gate 31 and biasing the anode region 11 positive with respect to the cathode contact region 17, electrons will be transferred from the cathode contact region to the first base region via the shunting means 26 and emitter region 16. As will be understood by one skilled in the art, the transfer of electrons from the emitter region 16 to the first base region 14 causes the thyristor to turn on.

Figure 1:
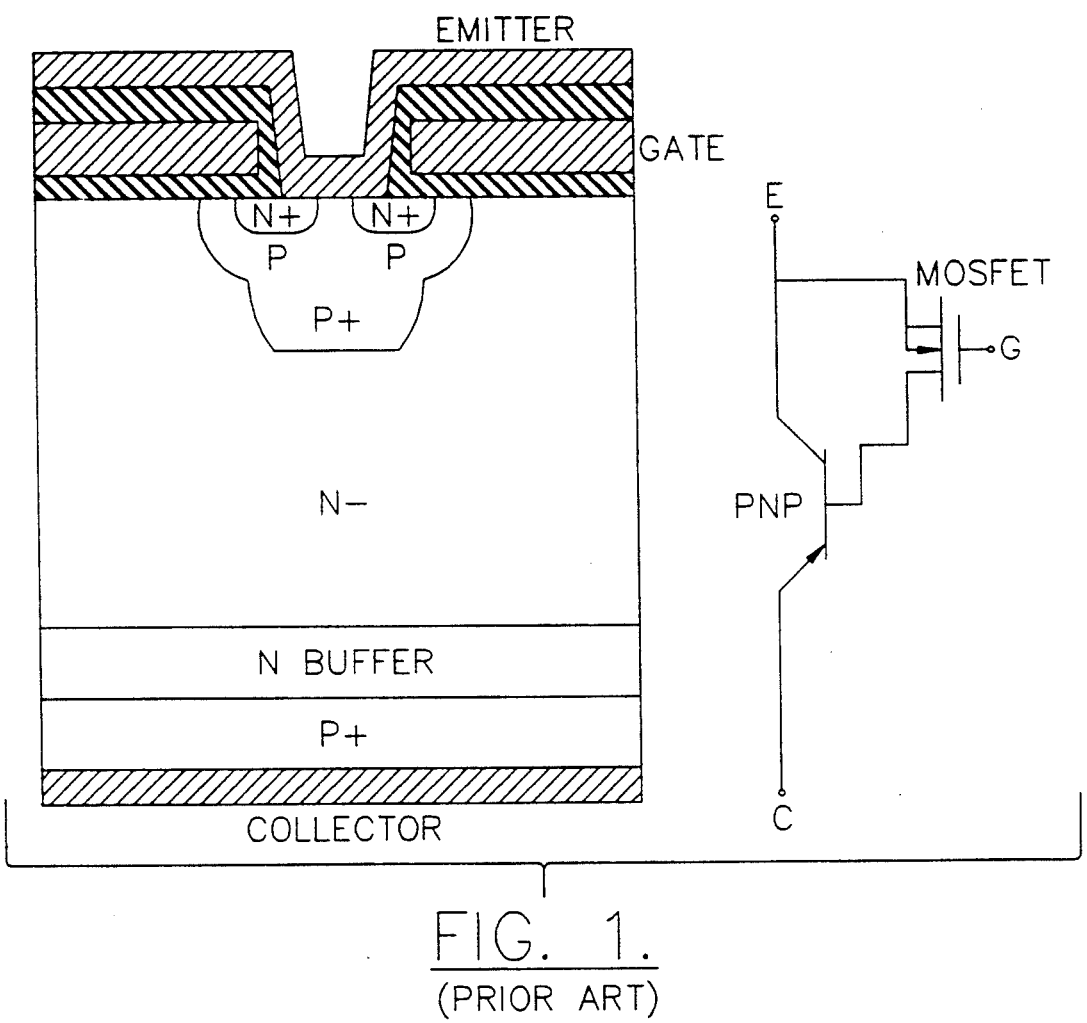
FIG. 1 illustrates a cross-sectional representation of a prior art Insulated Gate Bipolar Transistor (IGBT).
Figure 2:
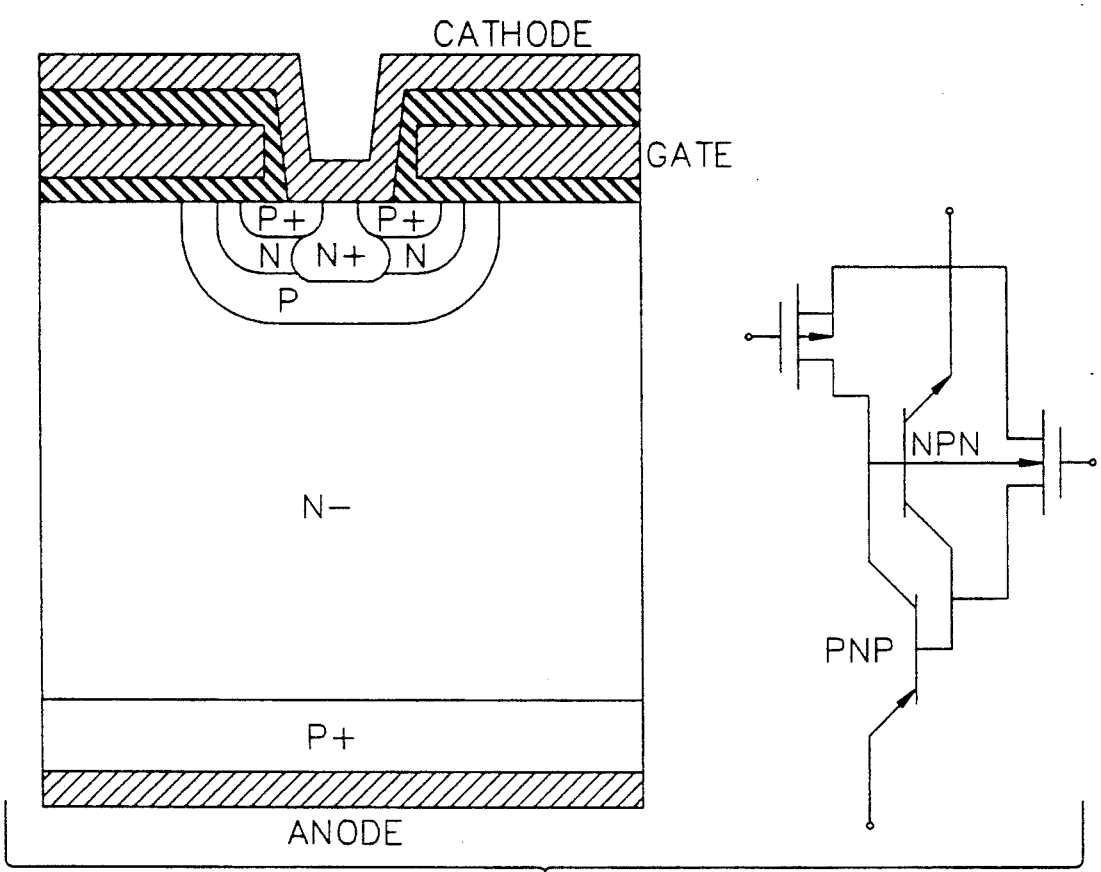
FIG. 2 illustrates a cross-sectional representation of a prior art MOS-Controlled Thyristor (MCT).
Figure 3:
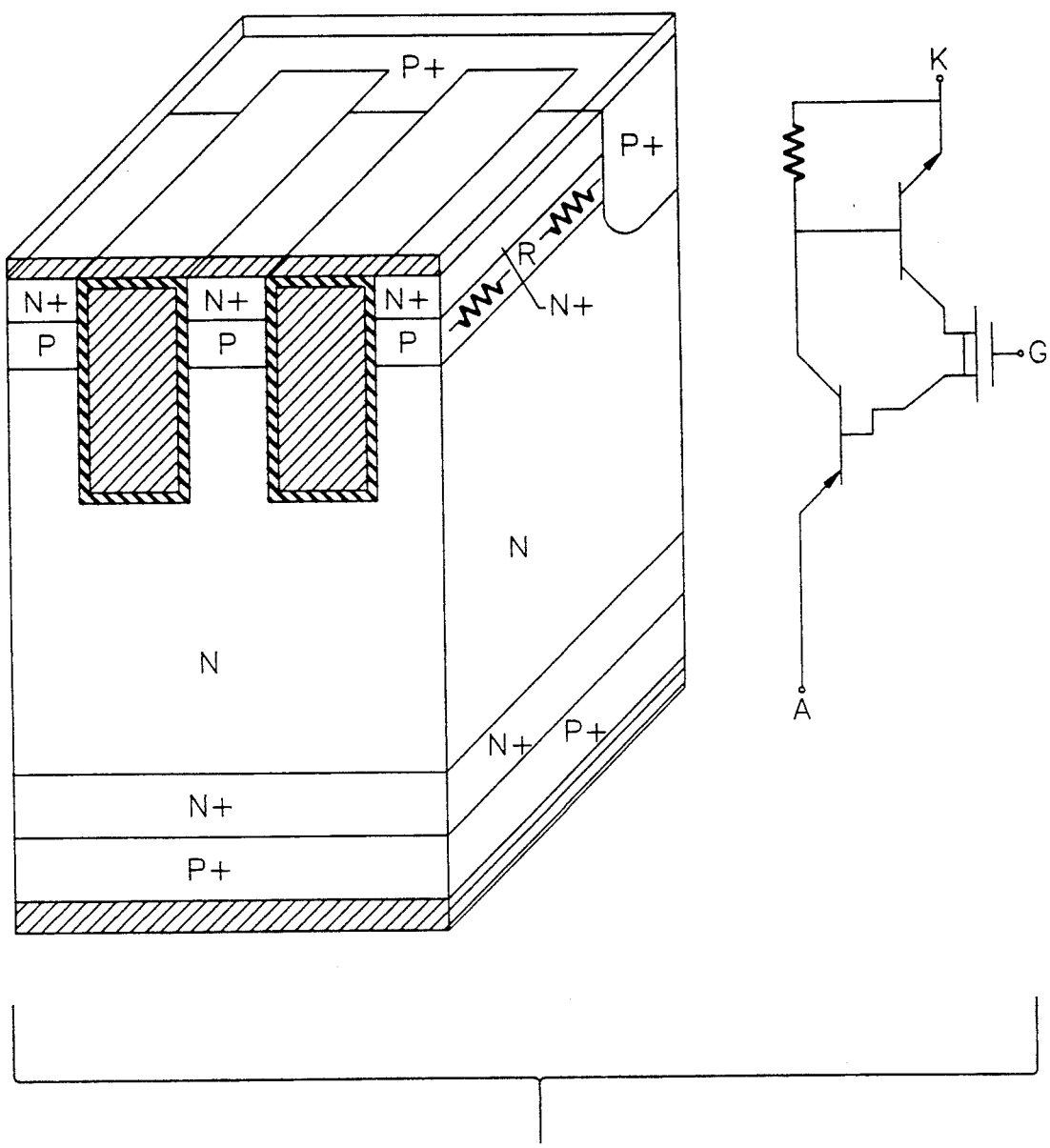
FIG. 3 illustrates a three-dimensional cross-sectional representation of a prior art Depletion Mode Thyristor (DMT).
Figure 4:
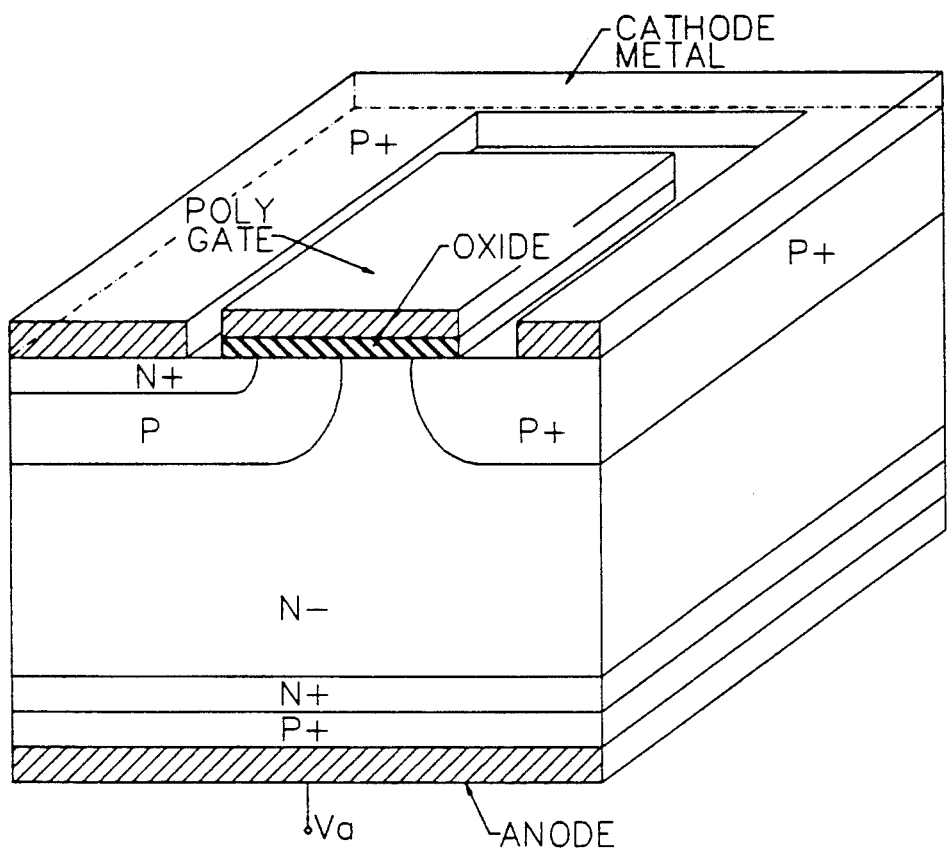
FIG. 4 illustrates a three-dimensional cross-sectional representation of a prior art Base Resistance Controlled Thyristor (BRT).
Figure 5A:
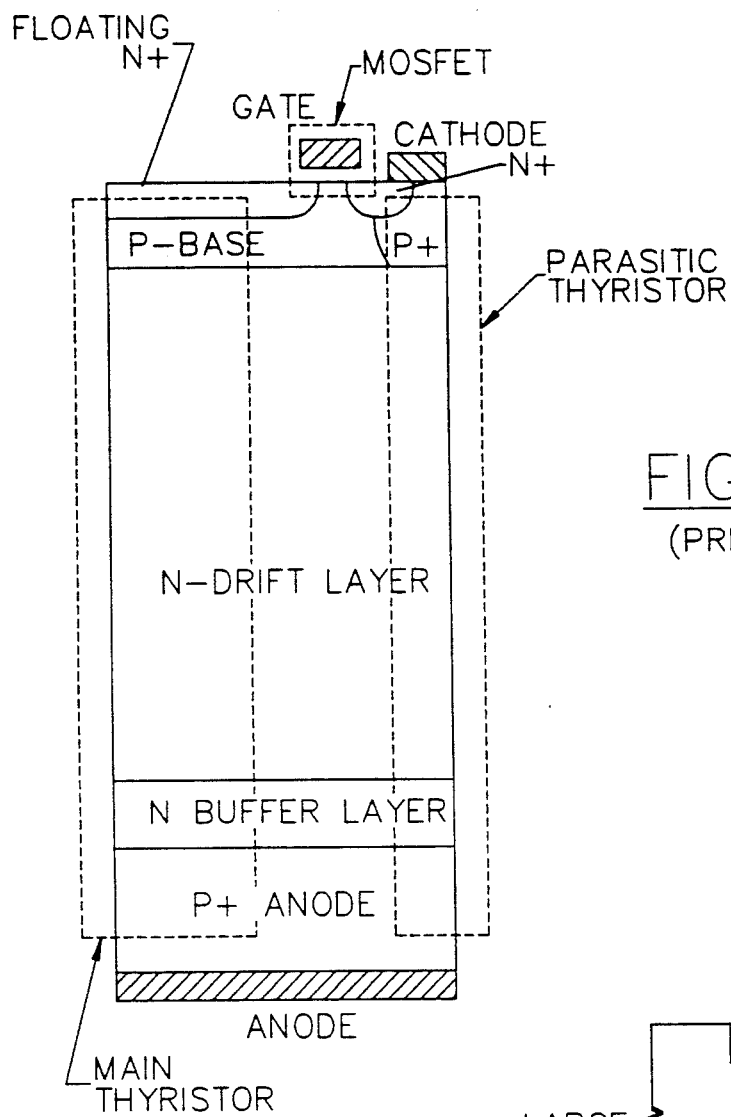
FIG. 5A illustrates a cross-sectional representation of a prior art Emitter Switched Thyristor (EST).
Figure 5B:
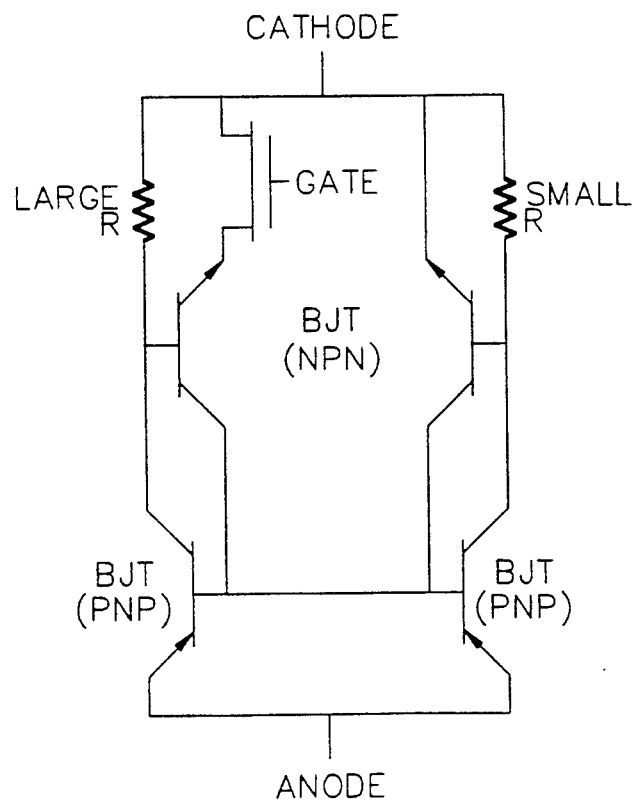
FIG. 5B illustrates an equivalent electrical circuit schematic for the EST shown in FIG. 5A.

The presence of a cathode contact region 17 of second conductivity type adjacent the emitter region 16 of first conductivity type, as opposed to a cathode contact region of first conductivity type employed in prior art devices, causes the suppression of conduction between the cathode contact region 17 and the anode region 11 when a turn-off bias signal is applied to the switching device 10. This has the twofold effect of not only preventing conduction in the thyristor formed by regions 11, 14, 15, and 16 but also preventing the formation of a parasitic thyristor between the cathode contact region 17 and anode region 11 and preventing the parasitic latch-up current that might otherwise result if those two regions and the regions directly therebetween formed a multilayered P-N-P-N parasitic thyristor as shown, for example, in the prior art device provided in FIG. 5A. Accordingly, by providing a cathode contact region 17 and an emitter region 16 of opposite conductivity type, the formation of a parasitic thyristor between the cathode contact region 17 and anode region 11 is prevented.

Figure 6B:
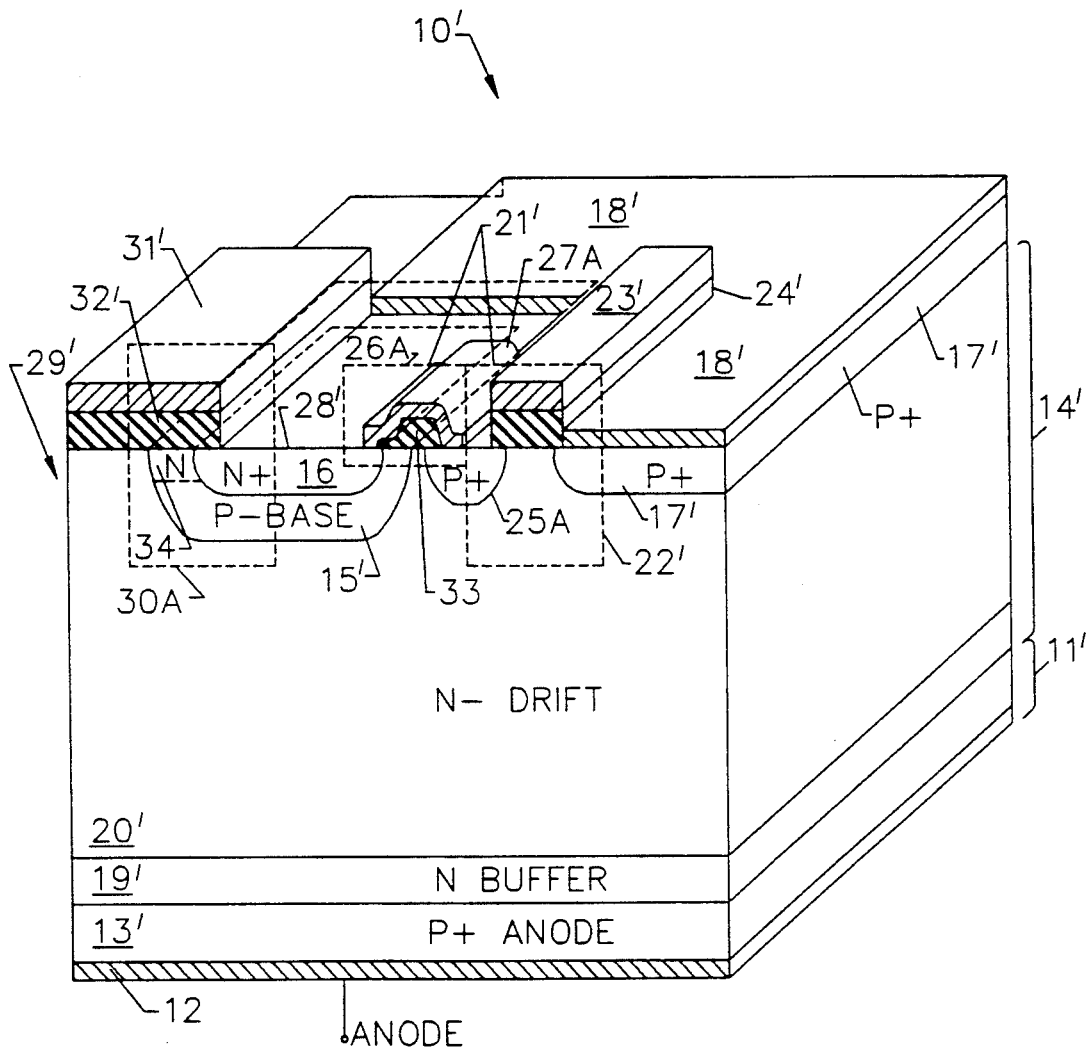
FIG. 6B illustrates a three-dimensional cross-sectional representation of a semiconductor switching device according to a second embodiment of the present invention.

Referring now to FIG. 6B, a second embodiment of the present invention will be described. Regions identical to those described with respect to FIG. 6A are marked with the same numeral but include a prime (') notation. In particular, the device of FIG. 6B differs from the device of FIG. 6A in three aspects. First, rather than having a source 25 electrically connected to the second base region 15 as provided in FIG. 6A, the source 25A and second base region 15' are separate, as shown. In addition, the shunting means 26A, comprising a metal strap 27A, includes an insulating region 33 to prevent leakage conduction from between the metal strap 27A and the first base region 14'. Finally, the turn-on gating means 30A includes a first conductivity type depletion-mode transistor having a gate 31', insulating region 32', and first conductivity type region 34 in the second base region 15'. In order to achieve single polarity turn-on and turn-off control, the gate 31' is preferably connected to the cathode contact metallization layer 18' and the gate 23' is preferably connected to a first bias signal for controlling the operation of the thyristor.

Figure 7:
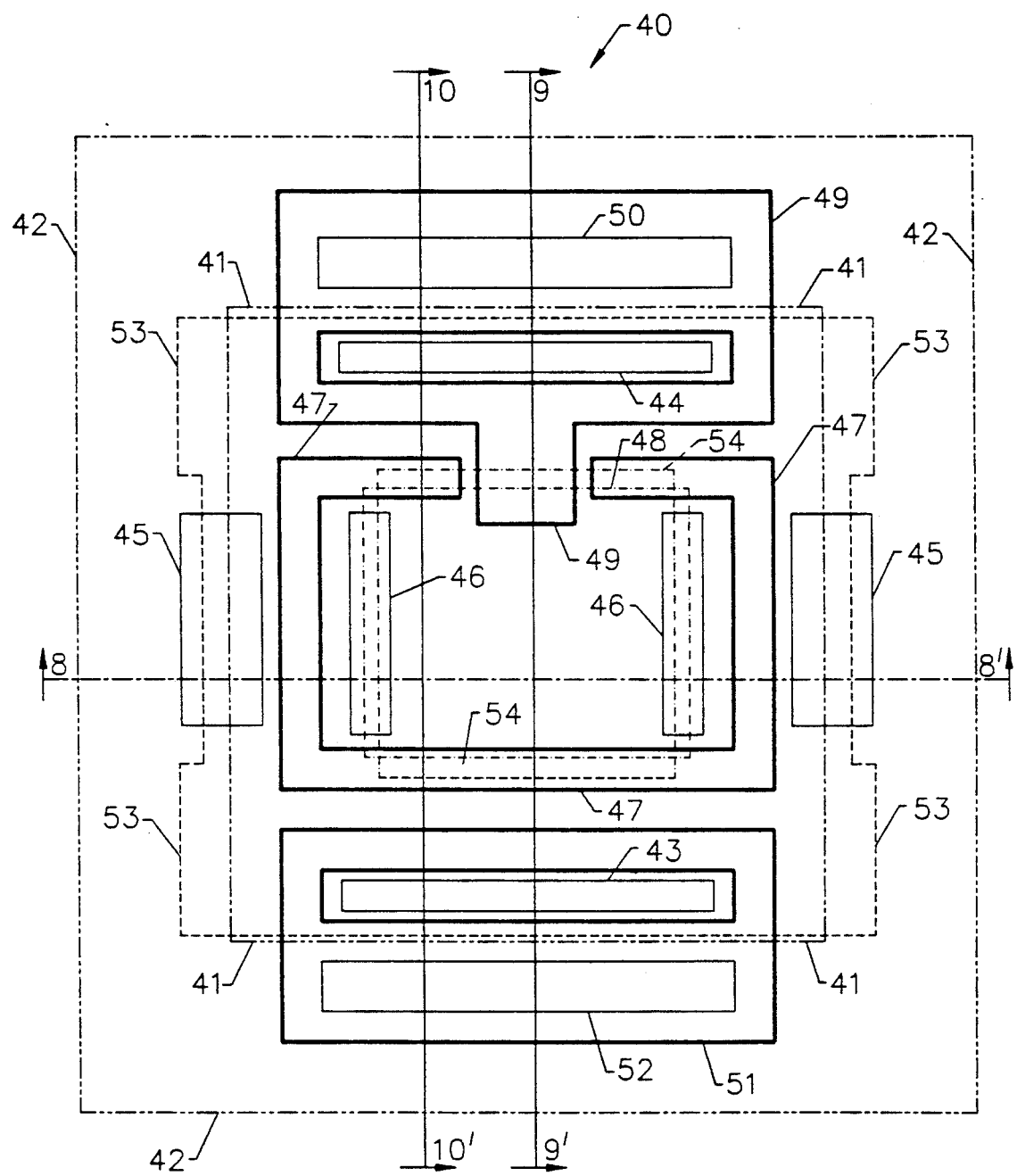
FIG. 7 illustrates a unit cell mask layout of a semiconductor switching device according to a third embodiment of the present invention.

Referring now to FIG. 7, a unit cell layout of a device according to a third embodiment of the present invention, providing pertinent mask regions, will be described. This third embodiment is preferred for applications requiring high levels of integration and the parallel connection of multiple cells for high current applications. Unlike the embodiments of FIGS. 6A and 6B, however, conduction between the cathode contact regions and emitter region and between the emitter region and first base region occurs in two substantially orthogonal directions as will be more fully described with respect to FIGS. 8–10.

The mask regions for the unit cell 40 include cathode contact regions defined between the edges of mask regions 41 and 42 and the cathode contact metallization regions defined by mask regions 43, 44 and 45. The metal straps which shunt current between the cathode contact regions and emitter region are defined by mask regions 46. The mask region for defining the pattern of the gate electrode for the first field effect transistors is shown by region 47. As described above, the first field effect transistor provides a portion of the electrical connection between the cathode contact regions and emitter region. The mask region for defining the emitter region is shown by region 48. The gate electrode for the transistor portion of the turn-on gating means is defined by mask region 49 and includes the mask region 50 for defining the metal contact to the gate electrode.

As described more fully hereinbelow with respect to FIGS. 8–10, a breakdown prevention means for electrically connecting the second base region to the cathode contact region during turn-off is provided by an enhancement-mode field effect transistor. The gate electrode for this transistor is defined by mask region 51. Electrical contact is made to this gate electrode by the metal contact defined by mask region 52. The various highly doped regions of second conductivity type surrounding the emitter region in the unit cell are defined between the edges of the mask regions 53 and 54. The operation of these regions will be described more fully hereinbelow with respect to FIGS. 8–10.

Figure 8:
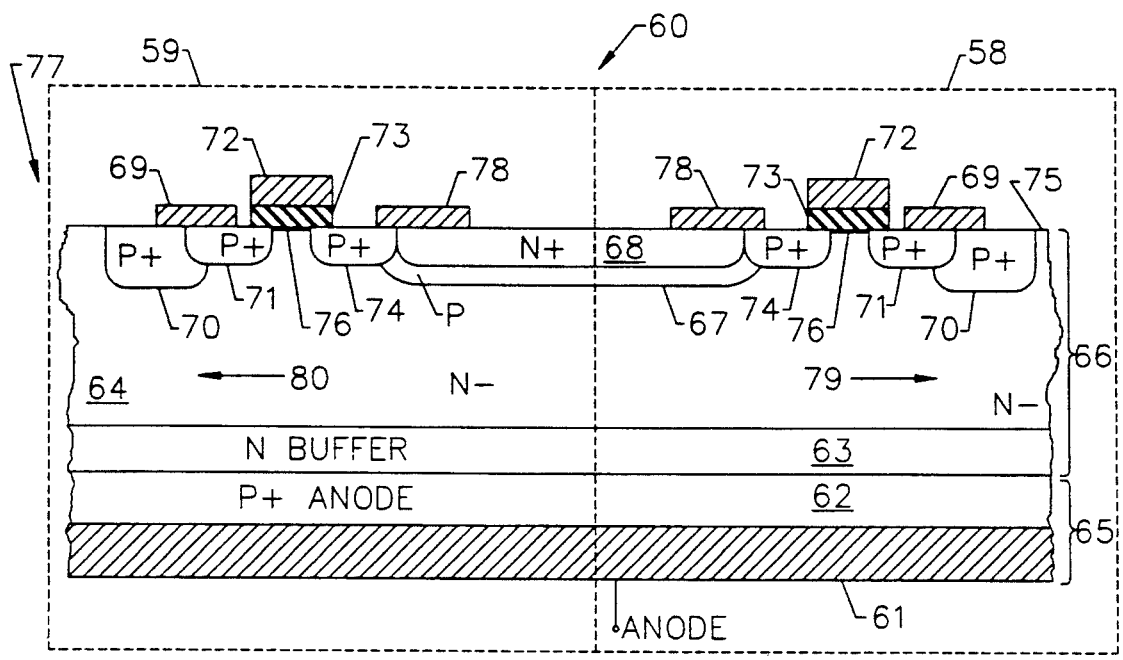
FIG. 8 illustrates a cross-sectional representation for the semiconductor switching device of FIG. 7, taken along line 8—8'.

Referring now to FIG. 8, the semiconductor switching device according to the third embodiment of the present invention will be described. FIG. 8 illustrates a cross-sectional view of the unit cell described in FIG. 7, taken along line 8—8' and includes a right-hand side 58, and a mirror image left-hand side 59. The switching device 60 includes coupled P-N-P and N-P-N regions which make up the thyristor. These regions include the anode region 65 (P), the first base region 66 (N), second base region 67 (P) and emitter region 68 (N). As shown, the anode region 65 preferably comprises an anode metallization layer 61 and highly doped anode region 62 (P+). The first base region 66 also includes a buffer layer 63 (N) and drift region 64 (N−).

The cathode contact metallization regions defined by mask region 45 in FIG. 7 are shown by cathode contacts 69. The highly doped cathode contact regions 70 and 71 are also defined in the first base region 66. These regions correspond to the mask regions 41, 42 and 53, 54 of FIG. 7, respectively. The means for electrically connecting the cathode contact regions 70, 71 to the emitter region 68 includes two field effect transistors, on opposite sides 58, 59. These transistors are defined by gate regions 72, insulating regions 73, source regions 74 and drain regions 71. As shown, these transistors are p-channel enhancement-mode MOSFETs. Accordingly, when the gate regions 72 are biased negative with respect to the first base region 66, a p-type channel 76 is created at the surface 75 of the semiconductor substrate 77. This negative bias represents the first bias signal which facilitates conduction in the thyristor by electrically connecting the cathode contact regions 70, 71 to the source regions 74. The gate regions 72 are defined by the mask region 47 shown in FIG. 7.

The shunting means for electrically connecting the source regions 74 to the emitter region 68 includes the metal straps 78 on the surface 75. As will be understood by one skilled in the art, if the source regions 74 are separated from the second base region 67, the metal strap 78 can be provided on top of an insulating region as described with respect to FIG. 6B, above. The combination of the shunting means and the field effect transistor also forms a conduction suppressing means between the cathode contact regions 70, 71 and the emitter region 68 and prevents the formation of a parasitic thyristor between the cathode contact regions 70, 71 and the anode region 65. In addition, in response to a turn-off bias signal being applied to gates 72, conduction is suppressed in a first direction 79 with respect to the conduction suppressing means on the right hand side of FIG. 8 and in a first direction 80 with respect to the conduction suppressing means on the left hand side of FIG. 8.

Figure 9:
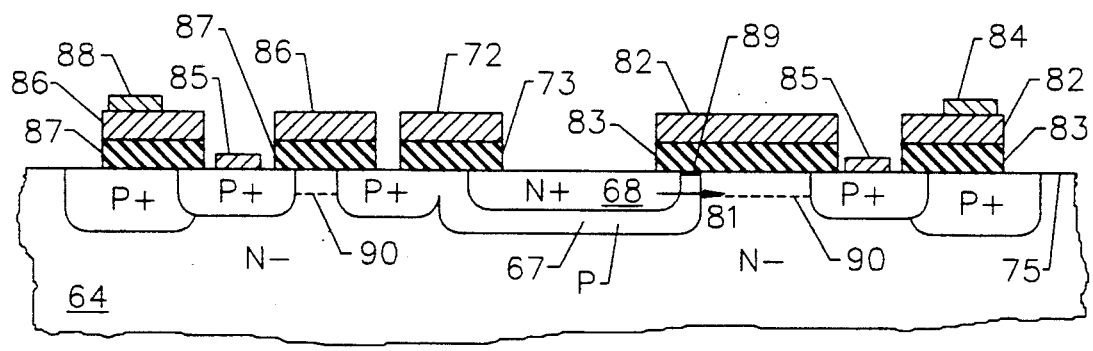

FIG. 9 illustrates a cross-sectional view of the unit cell of FIG. 7, taken along line 9—9'. In particular, both the structure for the turn-on gating means and breakdown prevention means are illustrated. The turn-on gating means includes an enhancement-mode field effect transistor having a gate 82 and gate insulating region 83. A gate contact metallization region 84 is also provided for making electrical connection to the gate. The gate 82 and metallization region 84 correspond to mask regions 49, 50 shown in FIG. 7. As will be understood by one skilled in the art, when a turn-on bias signal (positive) is applied to gate 82, a channel region 89 is formed at the surface 75 in the second base region 67. Accordingly, by applying a turn-on bias to the turn-on gating means, an electrical connection between the emitter region 68 and first base region 66 is provided. If an electrical connection between the emitter region 68 and cathode contact regions 71, 70 is also present, majority carriers from the emitter region will be provided between the emitter region 68 and first base region 66 in a second direction 81, substantially orthogonal to first directions 79 or 80 shown in FIG. 8.

Breakdown prevention means for electrically connecting the second base region 67 to the cathode contact 85 is also provided. The breakdown prevention means includes a field effect transistor having a gate 86, defined by mask region 51 in FIG. 7, an insulating region 87, and a gate contact metal layer 88, defined by mask region 52 in FIG. 7. The breakdown prevention means sweeps away excess majority carriers in the second base region 67 when the device 60 is turned off by the conduction suppressing means. The process of sweeping away excess carriers from the second base region 67 reduces the likelihood that the horizontal P-N-P transistor formed by regions 74, 64, and 71 shown in FIG. 8 will break down when the conductive channel 76 is eliminated during turn off. Accordingly, by providing a negative bias to gate 86, a p-type channel 90, shown by dotted lines, will be created at the surface 75, thereby electrically connecting the second base region 67 to the cathode contact 85 and providing conduction in a third direction 91. The breakdown prevention means may also include the gate regions 82 shown in FIGS. 9 and 10.

Figure 10:
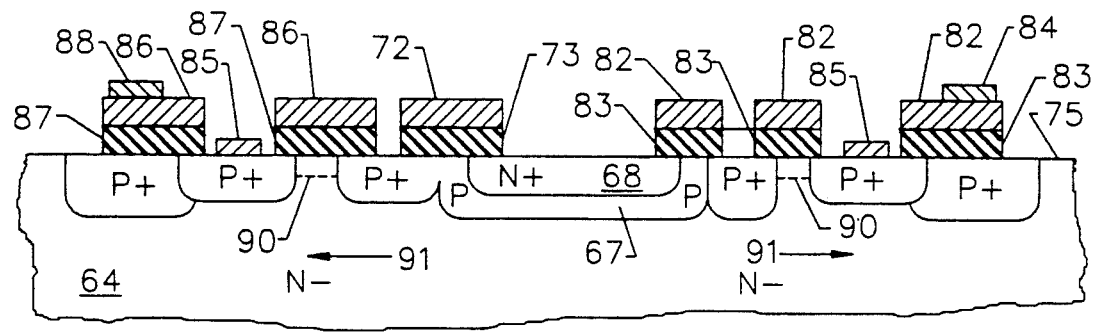
FIG. 10 illustrates a cross-sectional representation for the semiconductor switching device of FIG. 7, taken along line 10—10'.

FIG. 10 also illustrates a cross-sectional representation of the third embodiment shown in FIG. 7, taken along lines 10—10'. The cross-sectional representation is identical to one shown with respect to FIG. 9 except that the turn-on gating means is not illustrated.

Figure 11:
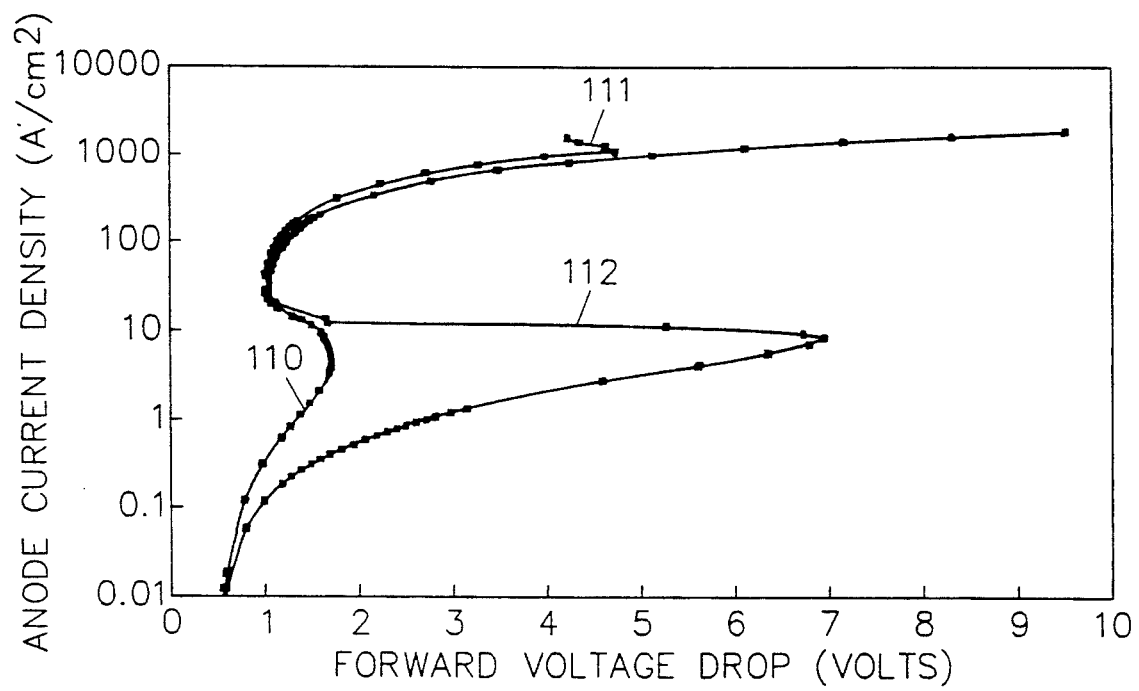
FIG. 11 illustrates a comparison of the forward I-V characteristics of an EST to the EST according to the present invention.

Referring now to FIG. 11, the forward I-V characteristics of an EST with parasitic thyristor (110) is plotted against an EST according to the present invention (112). As can be seen at high current densities in the range of 1000 A/cm$^2$, the conductivity of an EST according to the present invention is not dictated by parasitic thyristor latch-up shown by region 111. However, a higher forward voltage drop of about 0.3 volts (at 250 A/cm$^2$) is present in the present invention. This higher voltage drop is caused by the lower conductivity of the P-channel MOSFET ($V_g = -15$ volts) of the present invention as compared to the N-channel MOSFET ($V_g = 15$ volts) of the conventional EST. The I-V characteristics correspond to EST devices having an emitter length of 60 microns, NMOSFET and PMOSFET channel lengths of 1 micron, gate oxide thickness of 500 Å, P-base surface concentration of 5E17/cm$^3$ and N$^-$ layer thickness of 107 microns.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   an emitter switched thyristor having an anode region, a first base region, a second base region in said first base region, and a floating emitter region of first conductivity type in said second base region;
   a cathode contact region of second conductivity type, opposite said first conductivity type, in said first base region, adjacent said second base region, said cathode contact region forming a P-N junction with said first base region; and
   means, in said first base region and responsive to a first turn-on bias signal, for electrically connecting said cathode contact region of second conductivity type to said floating emitter region of first conductivity type, said means being further responsive to a first turn-off bias signal, for extinguishing conduction between said cathode contact region, said floating emitter region and said anode region to thereby prevent parasitic thyristor conduction in said first base region, between said cathode contact region and said anode region.

2. The semiconductor switching device of claim 1, wherein said electrical connecting and conduction extinguishing means comprises a first field effect transistor of second conductivity type, having an active region in said first base region and a source region of second conductivity type in said first base region, said first field effect transistor electrically connected between said floating emitter region and said cathode contact region.

3. The semiconductor switching device of claim 1, further comprising turn-on gating means responsive to a second turn-on bias signal for electrically connecting said floating emitter region to said first base region.

4. The semiconductor switching device of claim 2, further comprising turn-on gating means responsive to a second turn-on bias signal for electrically connecting said floating emitter region to said first base region, and shunting means for electrically connecting said source region of said first field effect transistor to said floating emitter region.

5. The semiconductor switching device of claim 4, further comprising an electrical insulating region between said shunting means and said second base region.

6. The semiconductor switching device of claim 4, wherein said shunting means comprises a conductive strap which electrically connects said source region of second conductivity type.

7. The semiconductor switching device of claim 4, wherein said turn-on gating means comprises a first conductivity type channel enhancement-mode MOSFET, and wherein said first field effect transistor comprises a second conductivity type channel enhancement-mode MOSFET.

8. A semiconductor switching device comprising:
   an emitter switched thyristor having an anode region, a first base region, a second base region, and a floating emitter region of first conductivity type in said second base region;
   a cathode contact region of second conductivity type, opposite said first conductivity type, in said first base region, adjacent said second base region, said cathode contact region forming a P-N junction with said first base region; and
   means responsive to a first bias signal for forming an electrical connection between said floating emitter region of first conductivity type and said cathode contact region of second conductivity type.

9. The semiconductor switching device of claim 8, wherein said means for forming an electrical connection comprises a first field effect transistor of second conductivity type in said first base region, electrically connected between said floating emitter region and said cathode contact region, said first field effect transistor having a source region of second conductivity type in said first base region, adjacent said cathode contact region.

10. The semiconductor switching device of claim 9, wherein said means for forming an electrical connection further comprises shunting means for electrically connecting said source region of said first field effect transistor to said floating emitter region.

11. The semiconductor switching device of claim 10, further comprising an electrical insulating region between said shunting means and said second base region.

12. The semiconductor switching device of claim 10, wherein said source region is electrically connected to said second base region of second conductivity type.

13. The semiconductor switching device of claim 10, further comprising turn-on gating means responsive to a second bias signal for electrically connecting said floating emitter region to said first base region.

14. The semiconductor switching device of claim 13, wherein said turn-on gating means comprises a first conductivity type channel enhancement-mode MOSFET, and wherein said first field effect transistor comprises a second conductivity type channel enhancement-mode MOSFET.

15. The semiconductor switching device of claim 13, wherein said turn-on gating means comprises a first conductivity type channel depletion-mode MOSFET having a gate electrode, and wherein the gate electrode of said depletion-mode MOSFET is electrically connected to said cathode contact region.

16. A semiconductor switching device comprising:
   a semiconductor substrate;
   an emitter switched thyristor in said semiconductor substrate, said thyristor having an anode region, a first base region, a second base region, and a floating emitter region of first conductivity type in said second base region, said floating emitter region being located at a face of said semiconductor substrate;

a cathode contact region of second conductivity type in said semiconductor substrate, said cathode contact region forming a P-N junction with said first base region;

a field effect transistor of second conductivity type at said face, electrically connected between said cathode contact region and said second base region, said field effect transistor having an active region in said first base region and a source region of second conductivity in said first base region, adjacent said cathode contact region; and a metal strap at said face, electrically connecting said source region of said first field effect transistor to said floating emitter region.

17. The semiconductor switching device of claim 16, further comprising a field effect transistor of first conductivity type having an active region in said second base region, electrically connected between said floating emitter region and said first base region.

18. The semiconductor switching device of claim 17, wherein said field effect transistor of second conductivity type comprises a second conductivity type channel enhancement-mode MOSFET at said face, and wherein said field effect transistor of first conductivity type comprises a first conductivity type channel enhancement-mode MOSFET at said face.

19. A semiconductor switching device comprising:
a semiconductor substrate;
an emitter switched thyristor in said semiconductor substrate, said thyristor having an anode region, a first base region, a second base region, and a floating emitter region of first conductivity type in said second base region;

a cathode contact including a cathode metallization layer on said substrate and a cathode contact region of second conductivity type in said first base region adjacent said floating emitter region, said cathode contact region forming a P-N junction with said first base region;

means, in said first base region and responsive to a first turn-off bias signal, for extinguishing conduction between said cathode contact region and said floating emitter region in sa first direction to thereby prevent parasitic thyristor conduction in said first base region, between said cathode contact region and said anode region; and turn-on gating means responsive to a turn-on bias signal for electrically connecting said floating emitter region to said first base region and providing conduction between said floating emitter region and said first base region in a second direction.

20. The semiconductor switching device of claim 19, wherein said first detection and said second direction are substantially orthogonal to one another.

21. The semiconductor switching device of claim 20, further comprising breakdown prevention means responsive to a second turn-off bias signal for electrically connecting said second base region to said cathode contact.

22. The semiconductor switching device of claim 20, further comprising breakdown prevention means responsive to a second turn-off bias signal for electrically connecting said second base region to said cathode contact and providing conduction between said second base region and said cathode contact in a third direction, substantially orthogonal to said first direction.

23. The semiconductor switching device of claim 21, wherein said breakdown prevention means comprises a second conductivity type channel enhancement-mode MOSFET in said first base region.

* * * * *

UNITED STATES PATENT AND TRADEMARK OFFICE
CERTIFICATE OF CORRECTION

PATENT NO. : 5,293,054
DATED : March 8, 1994
INVENTOR(S) : Shekar et al.

It is certified that error appears in the above-identified patent and that said Letters Patent is hereby corrected as shown below:

Item [56], Title page,
UNDER "REFERENCES CITED":

In Reference No. 7, "Shinobe" should be -- Shinohe --.

Title page,
UNDER "OTHER PUBLICATIONS":

Column 1, line 1, "Gaped" should be -- Gated --.

Column 2, line 13, "vol. 8" should be -- Vol. 9 --.

Column 1, line 4, after "Electron" insert -- Device --.

Column 2, line 9, "151" should be -- 152 --.

Column 2, line 7, "Three terminal MOS Controlled" should be -- Three-Terminal MOS-Controlled --.

Column 2, line 9, "Were" should be -- were --.

Column 4, line 57, after "$N^+$" omit the comma (,).

Column 6, line 27, "an" should be -- a --.

Column 6, line 66, "FIG. 8" should be -- FIG. 9 --.

Column 8, line 17, "Will" should be -- will --.

UNITED STATES PATENT AND TRADEMARK OFFICE
CERTIFICATE OF CORRECTION

PATENT NO. : 5,293,054
DATED : March 8, 1994
INVENTOR(S) : Shekar et al.

It is certified that error appears in the above-identified patent and that said Letters Patent is hereby corrected as shown below:

Column 11, line 5, "(110)" should be -- 110 --.

Column 11, line 7, "(112)" should be -- 112 --.

Column 12, line 7, after "type" insert -- to said floating emitter region of first conductivity type --.

Column 14, line 10, "sa" should be -- a --.

Column 14, line 20, "detection" should be -- direction --.

Signed and Sealed this

First Day of November, 1994

Attest:

BRUCE LEHMAN

*Attesting Officer*  *Commissioner of Patents and Trademarks*